(12) United States Patent
Jeng

(10) Patent No.: US 8,796,124 B2
(45) Date of Patent: Aug. 5, 2014

(54) DOPING METHOD IN 3D SEMICONDUCTOR DEVICE

(75) Inventor: Pei-Ren Jeng, Chu-Bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 20 days.

(21) Appl. No.: 13/280,838

(22) Filed: Oct. 25, 2011

(65) Prior Publication Data
US 2013/0102137 A1 Apr. 25, 2013

(51) Int. Cl.
*H01L 21/225* (2006.01)

(52) U.S. Cl.
USPC ............ 438/548; 257/344; 257/E21.415; 257/E21.19; 438/154; 438/585; 438/275

(58) Field of Classification Search
USPC .......... 257/344, E21.415, E21.19; 438/548, 438/154, 585, 275
See application file for complete search history.

(56) References Cited

U.S. PATENT DOCUMENTS

| | | | |
|---|---|---|---|
| 5,976,939 A | 11/1999 | Thompson et al. | |
| 6,090,690 A | 7/2000 | Moslehi | |
| 6,361,874 B1 | 3/2002 | Yu | |
| 6,413,802 B1 | 7/2002 | Hu et al. | |
| 6,706,571 B1 | 3/2004 | Yu et al. | |
| 6,858,478 B2 | 2/2005 | Chau et al. | |
| 7,173,310 B2 * | 2/2007 | Voldman et al. | 257/350 |
| 7,190,050 B2 | 3/2007 | King et al. | |
| 7,235,436 B1 * | 6/2007 | Lin et al. | 438/154 |
| 7,247,887 B2 | 7/2007 | King et al. | |
| 7,265,008 B2 | 9/2007 | King et al. | |
| 7,407,874 B2 | 8/2008 | Sasaki et al. | |
| 7,449,373 B2 | 11/2008 | Doyle et al. | |
| 7,494,862 B2 * | 2/2009 | Doyle et al. | 438/231 |
| 7,508,031 B2 | 3/2009 | Liu et al. | |
| 7,528,465 B2 | 5/2009 | King et al. | |
| 7,605,449 B2 | 10/2009 | Liu et al. | |
| 8,062,963 B1 | 11/2011 | van Dal | |
| 8,158,500 B2 * | 4/2012 | Anderson et al. | 438/585 |
| 8,212,295 B2 | 7/2012 | Liaw | |
| 8,278,173 B2 | 10/2012 | Lim et al. | |
| 8,278,196 B2 | 10/2012 | Huang et al. | |
| 8,310,013 B2 | 11/2012 | Lin et al. | |
| 8,338,305 B2 | 12/2012 | Chen et al. | |

(Continued)

OTHER PUBLICATIONS

K. Takeuchi, T. Fukai, T. Tsunomura, A.T. Putra, A. Nishida, S. Kamohara and T. Hiramoto; "Understanding Random Threshold Voltage Fluctuation by Comparing Multiple Fabs and Technologies;" 2007; pp. 467-470; IEEE; 1-4244-0439-X; Japan.

(Continued)

*Primary Examiner* — Lex Malsawma
*Assistant Examiner* — Sheng Zhu
(74) *Attorney, Agent, or Firm* — Haynes and Boone, LLP

(57) ABSTRACT

The present disclosure provides a method to dope fins of a semiconductor device. The method includes forming a first doping film on a first fin and forming a second doping film on the second fin. The first and second doping films include a different dopant type (e.g., n-type and p-type). An anneal process is performed which drives a first dopant from the first doping film into the first fin and drives a second dopant from the second doping film into the second fin. In an embodiment, the first and second dopants are driven into the sidewall of the respective fin.

15 Claims, 7 Drawing Sheets

(56) References Cited

U.S. PATENT DOCUMENTS

| | | |
|---|---|---|
| 8,357,569 B2 | 1/2013 | Pawlak et al. |
| 8,367,498 B2 | 2/2013 | Xu et al. |
| 8,373,229 B2 | 2/2013 | Chen et al. |
| 8,399,931 B2 | 3/2013 | Liaw et al. |
| 8,415,718 B2 | 4/2013 | Xu |
| 2005/0153490 A1 | 7/2005 | Yoon et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0228372 A1 | 10/2007 | Yang et al. |
| 2008/0258228 A1 | 10/2008 | Chuang et al. |
| 2008/0263492 A1 | 10/2008 | Chuang et al. |
| 2008/0290470 A1 | 11/2008 | King et al. |
| 2008/0296632 A1 | 12/2008 | Moroz et al. |
| 2009/0035909 A1* | 2/2009 | Chang et al. .................. 438/276 |
| 2009/0181477 A1 | 7/2009 | King et al. |
| 2009/0289300 A1* | 11/2009 | Sasaki et al. .................. 257/344 |
| 2010/0006945 A1 | 1/2010 | Merelle et al. |
| 2010/0006974 A1 | 1/2010 | Xu et al. |
| 2010/0052059 A1 | 3/2010 | Lee |
| 2010/0183961 A1 | 7/2010 | Shieh et al. |
| 2010/0203734 A1 | 8/2010 | Shieh et al. |
| 2010/0264468 A1 | 10/2010 | Xu |
| 2011/0117679 A1 | 5/2011 | Lee et al. |
| 2011/0147846 A1 | 6/2011 | Su et al. |
| 2011/0248348 A1 | 10/2011 | Gan et al. |
| 2011/0278676 A1 | 11/2011 | Cheng et al. |
| 2011/0282478 A1 | 11/2011 | Shen et al. |
| 2011/0283245 A1 | 11/2011 | Shen et al. |
| 2011/0317477 A1 | 12/2011 | Liaw |
| 2011/0317485 A1 | 12/2011 | Liaw |
| 2012/0009690 A1 | 1/2012 | Wann et al. |
| 2012/0012932 A1 | 1/2012 | Perng et al. |
| 2012/0104472 A1 | 5/2012 | Xu et al. |
| 2012/0126325 A1 | 5/2012 | Wang et al. |
| 2012/0126326 A1 | 5/2012 | Wang et al. |
| 2012/0126375 A1 | 5/2012 | Wang et al. |

OTHER PUBLICATIONS

Y. Sasaki, K. Okashita; K. Nakamoto; T. Kitaoka; B. Mizuno and M. Ogura; "Conformal Doping for FinFets and Precise Controllable Shallow Doping for Planar FET Manufacturing by a Novel $B_2H_6$/Helium Self-Regulatory Plasma Doping Process;" 2008; pp. 917-920; IEEE; 1-4244-2377-4; Japan.

Chinese Office Action issued by the Chinese Patent Office on Oct. 16, 2009, Application No. 200710167852, 7 pages.

* cited by examiner

DOPING METHOD IN 3D SEMICONDUCTOR DEVICE

BACKGROUND

The present disclosure relates generally to the field of fabrication of semiconductor devices, and more specifically to a method of fabricating a 3D CMOS device such as a fin-type field effect transistor (finFET), or a portion thereof.

Multiple-gate metal-oxide semiconductor field-effect transistors (MOSFETs) are MOSFETs that incorporate two or more gates into a single device. Some of these devices may be known as finFETs when their structure includes a thin "fin" extending from a substrate. Planar versions of the double-gate MOSFETs also exist without the fin. Silicon based finFETs have been successfully fabricated using conventional MOSFET technology. A typical finFET is fabricated on a substrate with an overlying insulating layer with a thin 'fin' extending from the substrate, for example, etched into a silicon layer of the substrate. The channel of the FET is formed in this vertical fin. A gate is provided over (e.g., wrapping) the fin. The multiple gate structure is beneficial in that there is a gate on both sides of the channel allowing gate control of the channel from both sides. Further advantages of finFETs include reducing the short channel effect and higher current flow.

However, introducing the suitable dopants into the fins of a finFET device may be difficult. For example, challenges arise in ensuring conformal sidewall doping. Current processes can lead to random doping fluctuations, poor step coverage, and/or other issues. Additionally, in particular as aspect ratio (e.g., fin height versus fin width) increases, implementing a method of doping the fin of a transistor, which can be integrated with a process or doping the fin adjacent transistor of a different type may be difficult.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. FinFET as the term is employed in the current disclosure provides any 3D or fin-based transistor. A finFET element may include a finFET device (e.g., transistor) or any portion thereof (e.g., a fin). In addition, though described herein comprising certain elements, one skilled in the art would recognize the applicability of the present disclosure to other 3D devices including fins.

Figure 1:
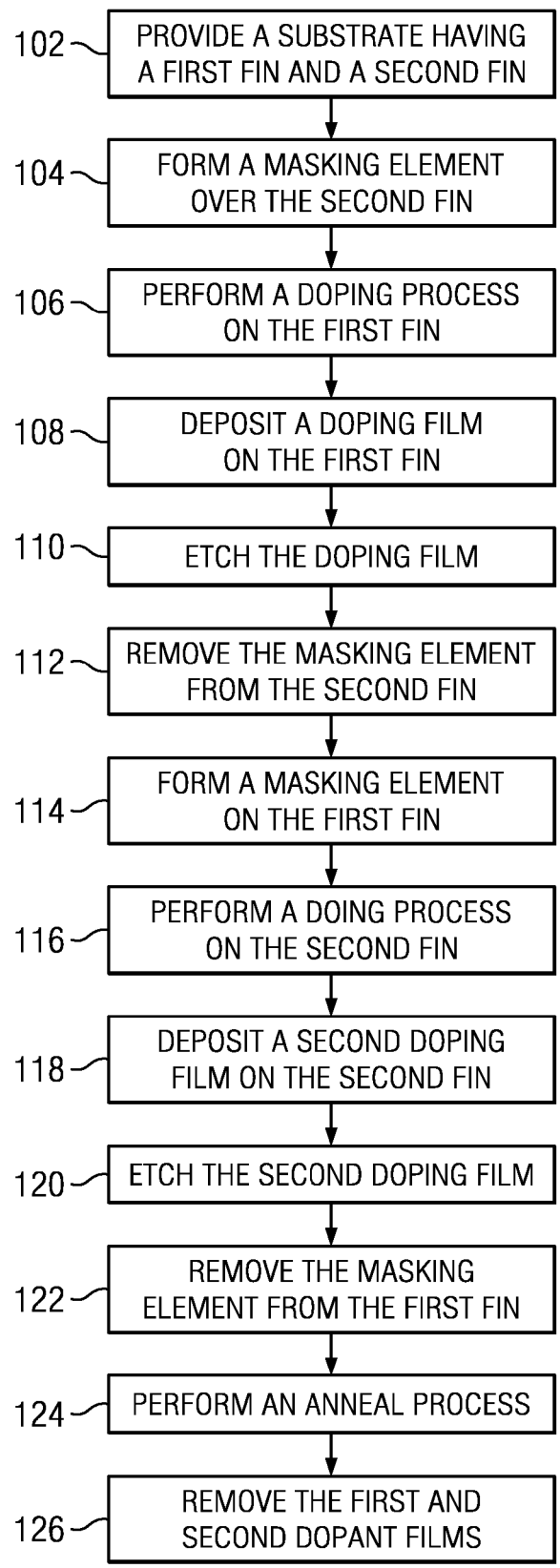
FIG. 1 is illustrates a flow chart of an embodiment of a method to fabricate a finFET semiconductor device or portion thereof in accordance with the present disclosure.

Illustrated in FIG. 1 is a method of semiconductor fabrication including the doping of fins disposed on a substrate. It is understood that the method 100 includes steps having features of a complementary metal-oxide-semiconductor (CMOS) technology process flow and thus, are only described briefly herein. Additional steps may be performed before, after, and/or during the method 100.

FIGS. 2-11 and 12 are cross-sectional view and perspective views, respectively, of an embodiment of semiconductor device 200 according to various stages of the method 100 of FIG. 1. It is understood that parts of the semiconductor device 200 may be fabricated by complementary metal-oxide-semiconductor (CMOS) technology process flow, and thus some processes are only briefly described herein. Further, the semiconductor device 200 may include various other devices and features, such as other types of devices such as additional transistors, bipolar junction transistors, resistors, capacitors, diodes, fuses, etc., but is simplified for a better understanding of the inventive concepts of the present disclosure. The semiconductor device 200 includes a plurality of semiconductor devices (e.g., transistors), which may be interconnected.

The method 100 begins at block 102 where a substrate is provided. In an embodiment, the substrate includes a silicon substrate (e.g., a wafer). The substrate may be silicon in a crystalline structure. In other embodiments, the substrate may include other elementary semiconductors such as germanium, or include a compound semiconductor such as, silicon carbide, gallium arsenide, indium arsenide, and indium phosphide. In an embodiment, the substrate includes a silicon-on-insulator (SOI) substrate. The SOI substrate may be fabricated using separation by implantation of oxygen (SIMOX), wafer bonding, and/or other suitable methods.

The substrate includes a plurality of fins including a first and second fin. The fins may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms a recesses into the silicon layer, leaving an extending fin. The recesses may be etched using reactive ion etch (RIE) and/or other suitable processes. Numerous other embodiments of methods to form a fin on a substrate may be suitable.

In an embodiment, the fins are approximately 10 nanometer (nm) wide and between approximately 10 nm and 60 nm high. However, it should be understood that other dimensions may be used for the fins. In an embodiment, the first and second fins comprise silicon. An insulting layer may interpose the fins or portions thereof.

In an embodiment, a channel of a device will be formed in the first fin (e.g., a channel of an n-type field effect transistor (FET)). Such a fin may be referred to in the present disclosure as an n-fin. In an embodiment, the second fin is associated with a p-type device (e.g., include a channel of a p-type FET or PFET). Such a fin may be referred to in the present disclosure as a p-fin.

Figure 2:
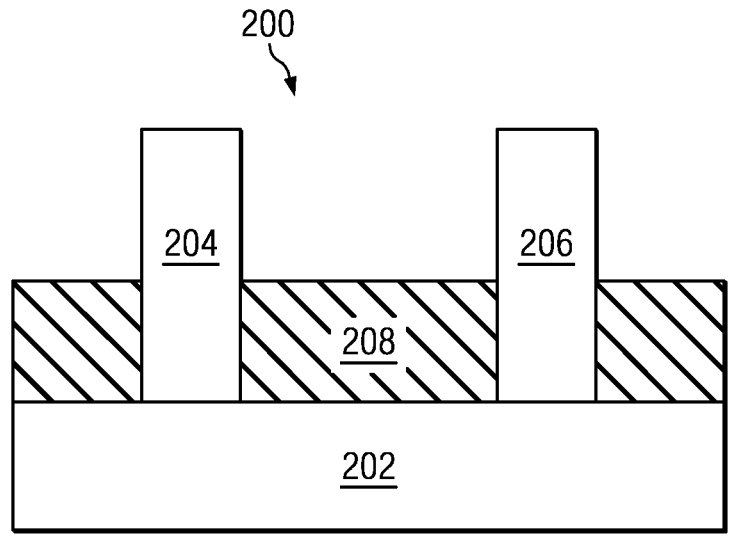
FIGS. 2-11 illustrate cross sectional views of an embodiment of a device 200 having fins fabricated according to one or more aspects of the method of FIG. 1.
Figure 3:
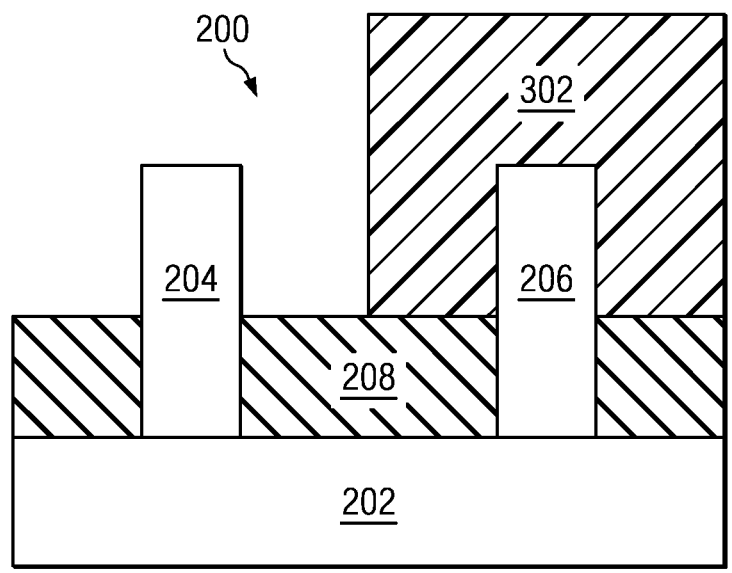

Referring to the example of FIG. 2, illustrated is a device 200 having a first fin 204 and a second fin 206 formed on a substrate 202. The substrate 202 may be a silicon substrate. The substrate 202 has an isolation region 208. The isolation region 208 may include one or more shallow trench isolation (STI) features. The first fin 204 and/or the second fin 206 may include silicon.

The method 100 then proceeds to block 104 where a masking element is formed over the second fin. The masking element may be formed using photosensitive material such as, photoresist. The masking element may include photoresist and/or layers such as anti-reflective coatings, hard mask materials, and/or other suitable materials. The masking element may be formed by suitable processes including spin-on coating, lithography processes including exposure, development, baking, and/or other processes known in the art. Referring to the example of FIG. 3, a masking element 302 is formed over the second fin 206. The masking element 302 may include photoresist. The masking element 302 may further include other materials and/or layers such as anti-reflective coatings, hard mask materials, and/or other suitable materials.

The method 100 then proceeds to block 106 where the first fin is doped. In an embodiment, the top surface of the first fin is doped. The doping process may include ion implantation, plasma doping, and/or other suitable process to introduce a first type of dopant to the first fin. In an embodiment, a p-type dopant is introduced to the first fin. For example, the doping process may include implanting boron. (As described in further detail below, in alternative embodiments of the method 100, n-type doping may be performed prior to p-type doping). In an embodiment of the method 100, block 106 is omitted.

Figure 4:
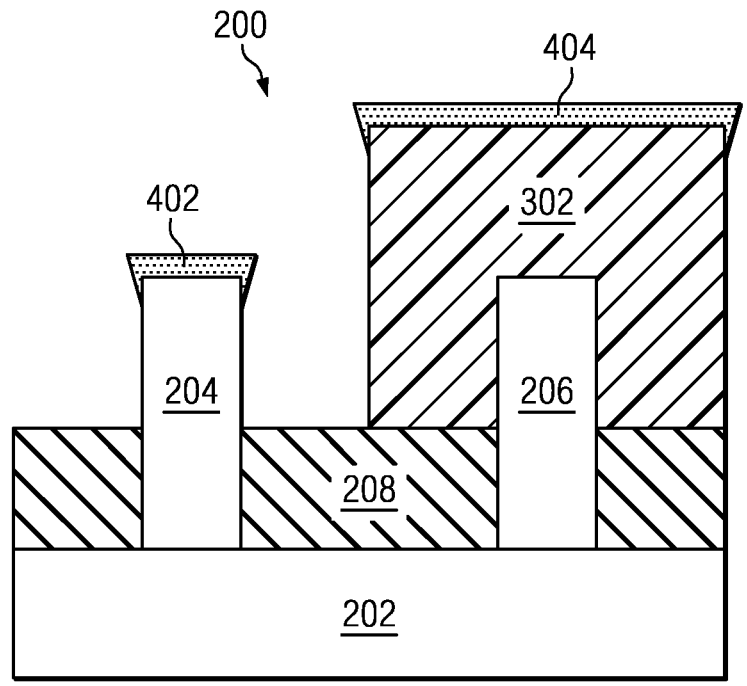

Referring to the example of FIG. 4, a doping process was performed that formed a doped region 402 of the first fin 204. It is noted that the doped region 402 is formed on the top surface of the first fin 204. However, other embodiments where the doped region 402 is provided at the top surface and/or a portion of the sidewalls of the first fin 204 may be possible. A doped region 404 is also formed on the masking element 302 (e.g. simultaneously with the doped region 402). In an embodiment, the doped region 402 and/or the doped region 404 may be omitted.

The method 100 then proceeds to block 108 where a doping film is formed on the substrate. The doping film may be formed on the first fin. Specifically, in an embodiment the doping film is formed such that it has a direct interface with the sidewalls of the first fin. The doping film may be between approximately 1 nanometer (nm) and approximately 10 nm in thickness. In an embodiment, the doping film is between approximately 2 nm and approximately 3 nm in thickness. The doping film may include silicon oxide (silica or $SiO_2$) with a dopant added. The dopant may be a p-type or n-type dopant. The dopant may be the same type as the dopant type provided by the doping process described above with reference to block 106.

In an embodiment, the dopant is a p-type dopant. The p-type dopant may include boron. Exemplary dopant compositions are between approximately 1 weight percent (wt %) and approximately 10 wt % of the p-type dopant (e.g., boron). In an embodiment, the dopant compositions are between approximately 2 wt % and approximately 4 wt % of the p-type dopant (e.g., boron). In an embodiment, the doping film is boro-silicate glass (BSG). The doping film may be blanket-deposited by atomic layer deposition (ALD), plasma-enhanced ALD (PEALD), plasma enhanced chemical vapor deposition (PECVD) processes, and/or other suitable processes. One of more of these processes may use $B_2H_6$, $BF_3$, $PH_3$, $AsH_3$, and/or other suitable doping precursors.

Figure 5:
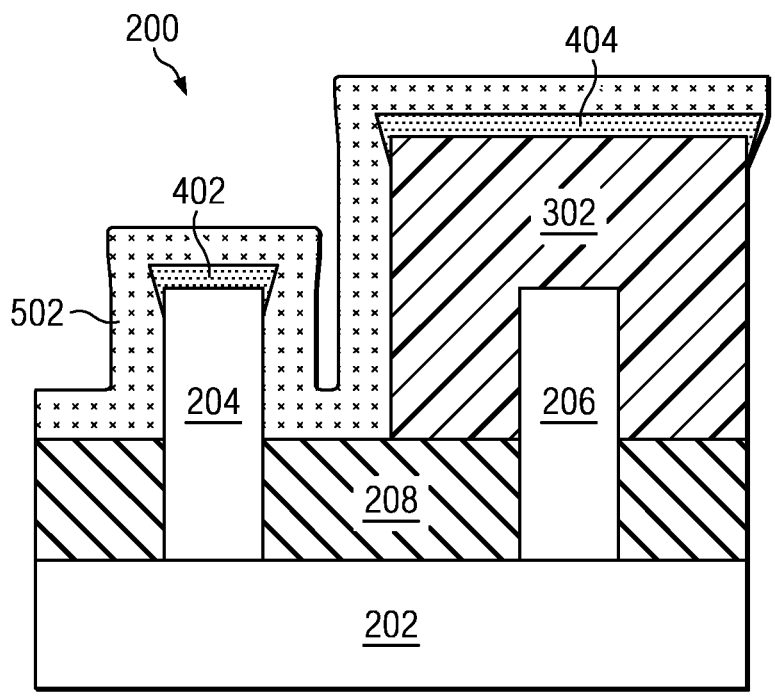

Referring to the example of FIG. 5, a doping film 502 is formed on the substrate 202. The doping film 502 includes an interface (e.g., direct interface) with the sidewalls of the first fin 204. The sidewalls as described herein include the walls of the fin that are substantially perpendicular to the top surface of the substrate 202 (or isolation region 208). In an embodiment, the doping film 502 is BSG.

The method 100 then proceeds to block 110 where the doping film is etched. The etching process may include removing the doping film from the masking element, described above with reference to block 204. Removal of the doping film from the masking element may allow for the masking element to be easily stripped from the substrate using typical processes. The doping film may be etched using dry etch, plasma etch, and/or other suitable processes. Referring to the example of FIG. 6, the doping layer 502 has been etched to provide the etched doping layer 602. The etched doping layer 602 remains on the sidewalls of the first fin 204.

Figure 6:
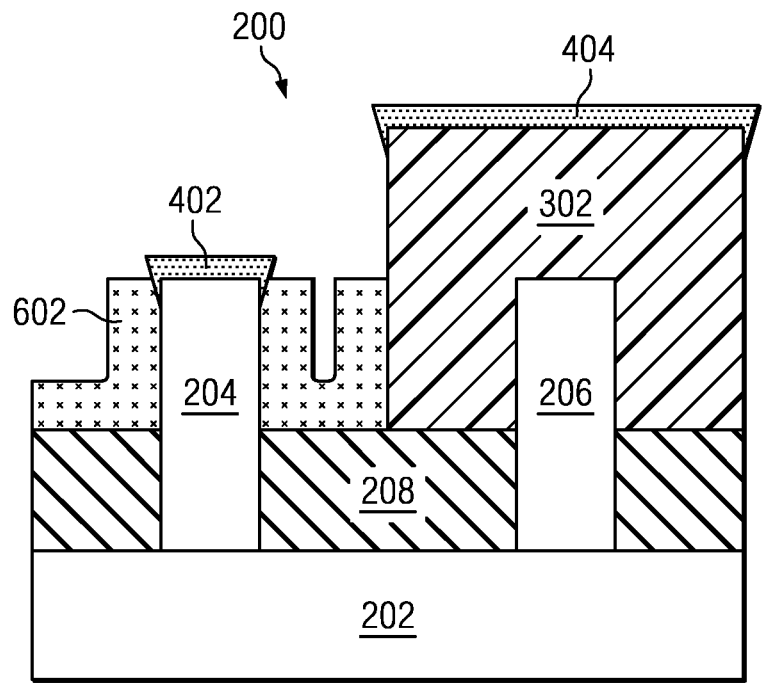
Figure 7:
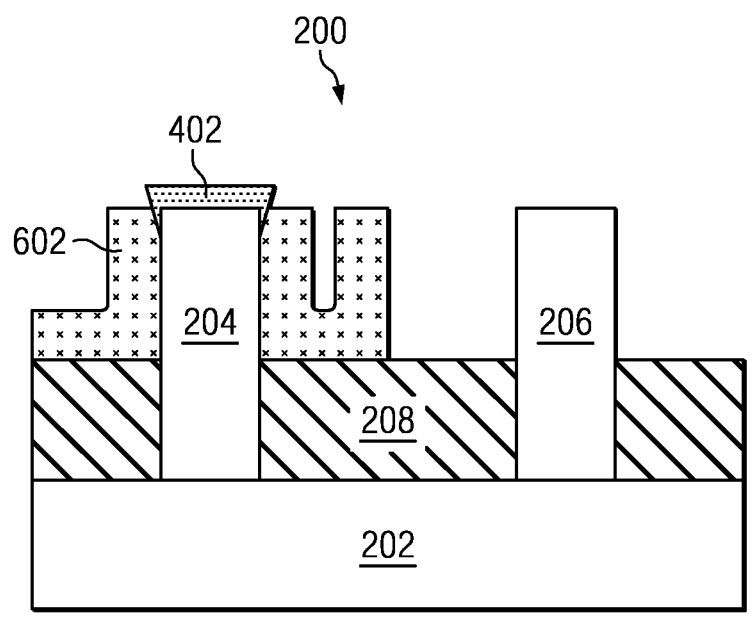

In the illustrated embodiment of FIG. 6, the doping layer is removed from the top of the first fin 204. In such an embodiment, the doping profile of the first fin 204 may be varied and/or controlled by differing dopant concentrations provided by the doping process of block 106 and the dopant layer, as described in further detail below. In another embodiment, the etched doping layer remains on the top of the fin 204. For example, the etched doping layer 602 may interface with the doped region 402. In yet a further embodiment, the doped region 402 may be omitted and the etched doping layer 602 interfaces with the top surface of the fin 204.

The method 100 then proceeds to block 112 where the masking element is removed from the substrate and the second fin. The masking element may be removed using suitable stripping processes. Referring to the example of FIG. 7, the masking element 302, described above with reference to FIG. 3, has been removed.

The method 100 then proceeds to block 114 where a masking element is formed over the first fin. The masking element may include photoresist and/or other suitable materials including, for example, hard mask material, anti-reflective coatings and the like. The masking element may be formed by suitable processes including spin-on coating, lithography processes including exposure, development, baking, and/or other processes known in the art. Referring to the example of FIG. 8, a masking element 802 is formed over the first fin 204. The masking element 802 is also disposed on and protects the etched doping layer 602. The masking element 802 may include photoresist. The masking element 802 may further include other materials and/or layers such as anti-reflective coatings, hard mask materials, and/or other suitable materials.

The method 100 then proceeds to block 116 where the second fin is doped. In an embodiment, the top surface of the second fin is doped. The doping process may include ion implantation, plasma doping, and/or other suitable process. The doping process of block 116 may include doping with a different (e.g., opposite) dopant type than the doping process of block 106. In an embodiment, an n-type dopant is introduced to the second fin. For example, the doping process may include implanting phosphorus or arsenic. (As described in further detail below, in alternative embodiments of the method 100, n-type doping may be performed prior to p-type doping; for example, the doping process of block 116 may introduce a p-type dopant). In an embodiment of the method 100, block 116 is omitted.

Figure 8:
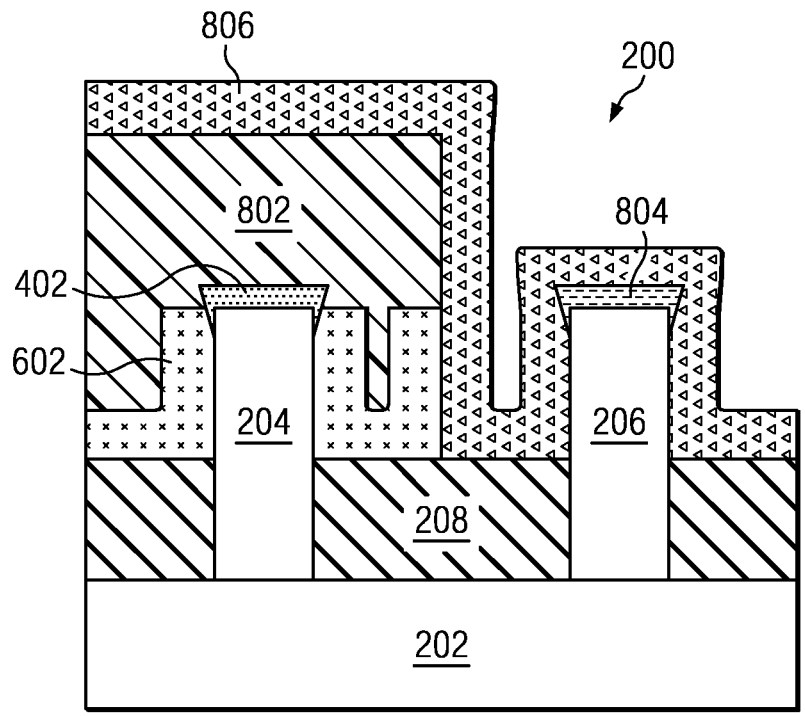

Referring to the example of FIG. 8, a doping process was performed that formed a doped region 804 of the second fin 206. It is noted that the doped region 804 is formed on the top surface or region of the first fin 206. However, other embodiments where the doped region 804 is provided at the top surface and/or a portion of the sidewall regions of the first fin 206 may be possible. In embodiments, the top surface of the masking element 802 may also be doped (e.g., simultaneously with providing doped region 804). In an embodiment, the doped region 804 may be omitted.

The method 100 then proceeds to block 118 where a doping film is formed on the substrate. The doping film may be formed on the second fin. In an embodiment, the doping film is formed such that it has a direct interface with the sidewalls of the second fin. The doping film may be between approximately 1 nanometer (nm) and approximately 10 nm in thickness. In an embodiment, the doping film is between approximate 2 nm and approximately 3 nm. The doping film may include silicon oxide (silica or $SiO_2$) with a dopant added. The dopant may be a p-type or n-type dopant. In an embodiment, the dopant of the doping film of block 118 is of a different (e.g., opposite) type as the dopant of the doping layer deposited in block 108 of the method 100. In an embodiment, the dopant of the doping film of block 118 is an n-type dopant. The n-type dopant may include phosphorus or arsenic. Exemplary dopant compositions are between approximately 1 wt % and approximately 10 wt % of the dopant (e.g., phosphorus, arsenic). In an embodiment, the dopant compositions are between approximately 2 wt % and approximately 4 wt % of the dopant (e.g., phosphorus, arsenic). In an embodiment, the doping film is phosphosilicate glass (PSG). The doping film may be blanket deposited by atomic layer deposition (ALD), plasma-enhanced ALD (PEALD), plasma enhanced chemical vapor deposition (PECVD) processes and/or other suitable processes.

Referring to the example of FIG. 8, a doping film 806 is formed on the substrate 202. The doping film 806 includes an interface with the second fin 206. The doping film 806 is formed on the sidewalls of the second film 206. In an embodiment, the doping film 806 is PSG.

The method 100 then proceeds to block 120 where the doping film, described above with reference to block 118, is etched. The doping film may be removed from the masking element, described above with reference to block 114. Removal of the doping film from the masking element may allow for the masking element to be easily stripped from the substrate using typical processes. The doping film may be etched using a wet etch process, a dry etch process, a plasma etch process, and/or other suitable processes. Referring to the example of FIG. 9, the doping layer 806 has been etched to provide the etched doping layer 902. The etched doping layer 902 remains on the sidewalls of the second fin 206.

Figure 9:
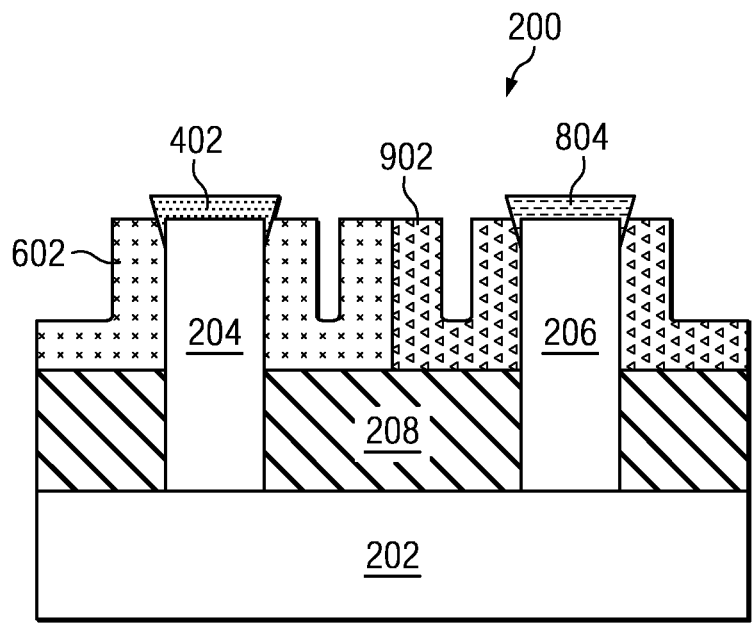

In the illustrated embodiment of FIG. 9, the doping layer is removed from the top of the second fin 206. In such an embodiment, the doping profile of the first fin 206 may be varied and/or controlled by differing dopant concentrations provided by the doping process of block 116 and the dopant layer, as described in further detail below. In such an embodiment, the etched doping layer 902 may interface with the doped region 804. In a further embodiment, the doped region 804 may be omitted and the etched doping layer 902 interfaces directly with the top surface of the fin 206 (e.g., silicon).

The method 100 then proceeds to block 122 where the masking element, described with reference to block 114, is removed from the substrate and the first fin. The masking element may be removed using suitable stripping processes.

Referring to the example of FIG. 9, the masking element 802, described above with reference to FIG. 8, has been removed.

The method 100 then proceeds to block 124 where a high temperature process (e.g., anneal) is performed on the substrate. The anneal process may include a temperature of approximately 700 Celsius (C) to approximately 1400 C. In an embodiment, the anneal process has a process temperature of less than approximately 1200 C. The dwell time of the anneal process may be between approximately 100 nanoseconds and approximately 1.5 seconds. The high temperature process may serve to drive-in the dopants from the doping layers formed on the first and second fin into the respective fin. For example, in an embodiment, the high temperature process drives in dopants from the first doping layer into the first fin. In an embodiment, the high temperature process drives dopants from the second doping layer into the second fin.

Figure 10:
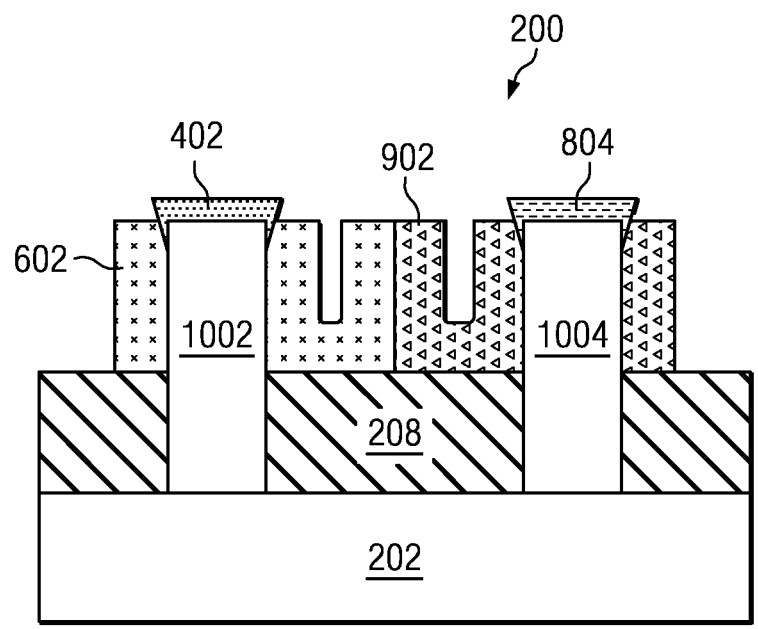
Figure 11:
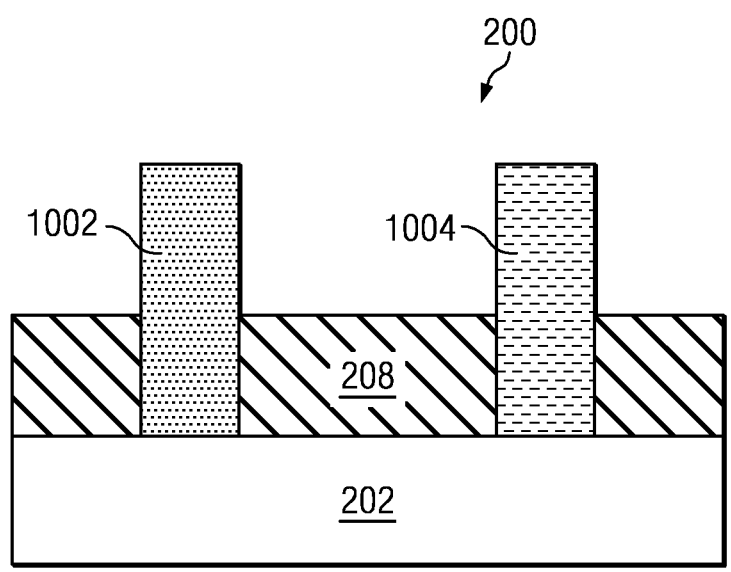
Figure 12:
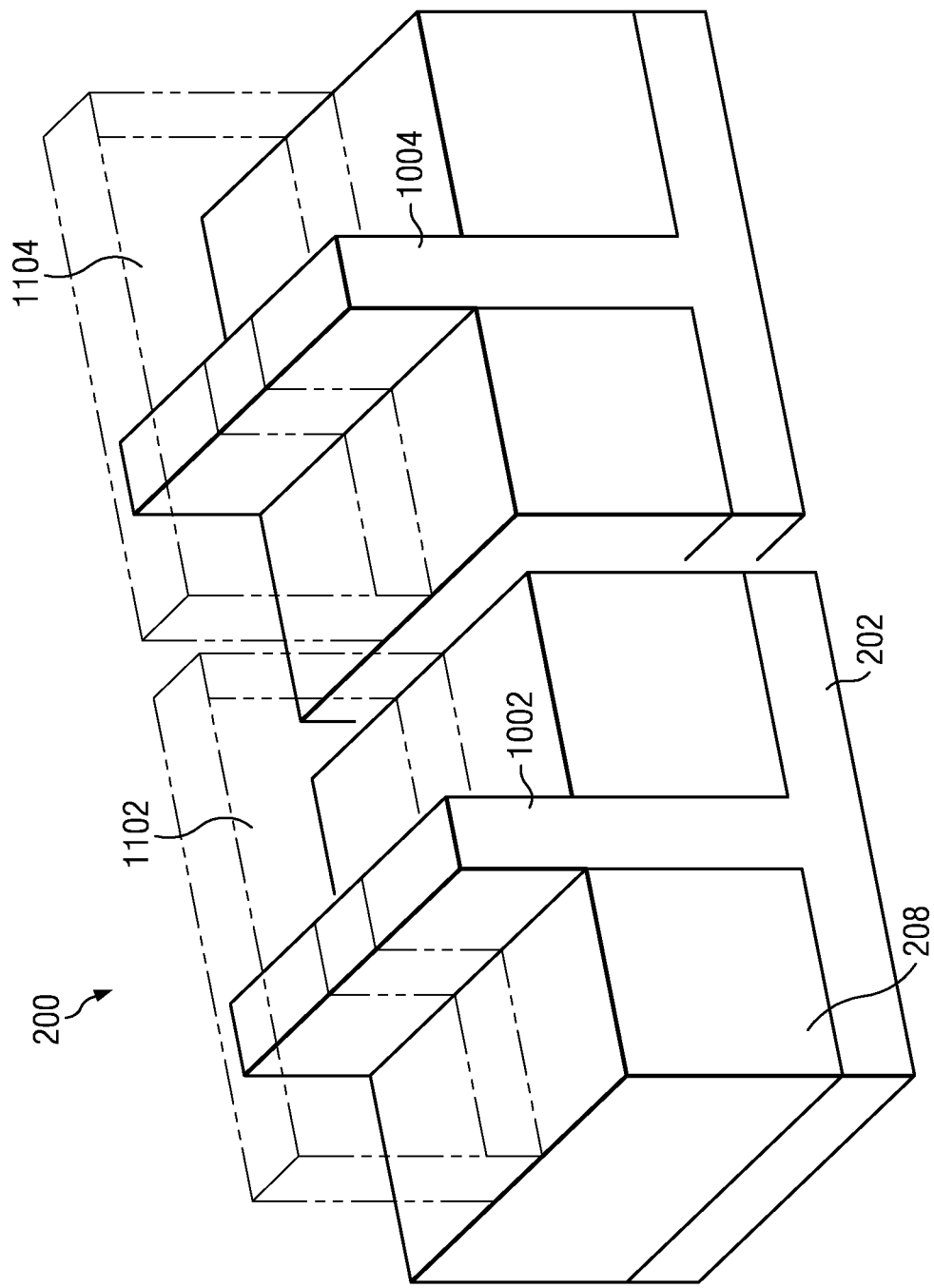
FIG. 12 illustrates a perspective view of an embodiment of the device 200.

Referring to the example of FIG. 10, an anneal is performed. Dopants from the doping layer 602 are driven into the first fin 204 providing first doped fin 1002. Thus, the doped fin 1002 may be a p-fin (e.g., including p-type dopants from the doping layer 602). The doped fin 1002 may provide a channel region for a device (e.g., finFET). Dopants from the doping layer 902 have been driven into the second fin 206 providing second doped fin 1004. The doped fin 1004 may provide a channel region for a device (e.g., finFET). The doped fin 1004 may be an n-fin (e.g., including n-type dopants from the doping layer 902). It is noted that the first doped fin 1002 and the second doped fin 1004 may be formed (e.g., doped) simultaneously.

The method 100 then proceeds to block 126 where the remaining doping layers are removed from the substrate. The doping layers may be removed by wet etching or stripping, and/or other processes known in the art. Referring to the example of FIG. 11, the device 200 includes the first doped fin 1002 and the second doped fin 1004. The first doped fin 1002 having a different dopant type than the second doped fin 1004.

In other embodiments of the method 100, the doping and doping layer for the n-fin may be formed prior to the doping and doping layer for the p-fin (e.g., embodiments of blocks 116 and 118 may precede embodiments of blocks 106 and 108).

Thus, provided is a method of doping fins formed on a substrate. The doped fins may be used to form portions of n-type or p-type finFET devices, for example form a channel region on which a structure is formed. The method 100 may proceed to other steps of fabrication including forming a gate structure on and/or around the first and second fin respectively (e.g., gates of the respective finFET devices). The formation of the gate structure may include forming a metal gate by a replacement gate methodology, a polysilicon gate structure, and/or other suitable structures. A source/drain region may also be formed for each finFET device. Referring to the example of FIG. 12, a gate structure 1102 has been formed on the fin 1002 and a gate structure 1104 has been formed on the fin 1004. The gate structure 1102 and the gate structure 1104 may be associated with different types of transistors. For example, the gate structure 1102 may be a portion of an nMOS transistor; the gate structure 1104 may be a portion of a pMOS transistor. The gate structure 1102 and/or 1104 may include a gate dielectric layer (e.g., high-k dielectric) and a gate electrode layer (e.g., a work function metal). Numerous other layers may also be included in the gate structure such as, for example, interface layers, capping layers, fill layers, etch stop layers, and the like.

In summary, the methods and devices disclosed herein provide for doping of fins formed on a semiconductor substrate. In doing so, the present disclosure offers several advantages over prior art devices. One advantage of an embodiment of the disclosure is that the doping of fins may provide uniform sidewall doping for the 3D device structures (e.g., finFET devices). For example, as the doping layers provide a uniform interface with the fin structure, substantially uniform doping may be provided to and through the sidewalls of the device. Advantages of embodiments also include a process which integrates the doping of fins for both n-type and p-type devices. Yet another advantage of some embodiments described herein is the ability to control the doping profile for device performance and/or proper gate dielectric growth on the fin (e.g., Si orientation of the fin is controlled). For example, because of the doping of the top surface followed by the deposition of the doping layer, the doping profile of the fin may be controlled and/or tuned for performance. If the surface concentration is higher this may allow for a 3D device having a shallow junction.

It is understood that different embodiments disclosed herein offer different disclosure, and that they may make various changes, substitutions and alterations herein without departing from the spirit and scope of the present disclosure.

Thus, described is an embodiment of a method to dope fins of a semiconductor device. The method includes forming a first doping film on a first fin and forming a second doping film on the second fin. The first and second doping films include a different dopant type (e.g., n-type and p-type). An anneal process is performed which drives a first dopant from the first doping film into the first fin and drives a second dopant from the second doping film into the second fin. In an embodiment, the first and second dopants are driven into the sidewall of the respective fin.

In another embodiment, a method is described that includes providing a semiconductor substrate having a first fin and a second fin. A first doping film is formed on the first fin such that the first doping film is formed on a first sidewall of the first fin and on a second opposing sidewall of the first fin. A second doping film on the second fin such that the second doping film is formed on a third sidewall of the second fin and on a fourth opposing sidewall of the second fin. A high temperature process (e.g., anneal) is then performed on the substrate including that simultaneously drives an n-type dopant from the first doping film into the first fin and a p-type dopant from the second doping film into the second fin.

In still another embodiment, a method is described that includes providing a semiconductor substrate having a first fin and a second fin. A top surface of the first fin is doped (e.g., ion implantation of an n-type dopant). After doping the top surface of the first fin, a first doping film having a first dopant type (e.g., n-type) is formed on the first fin such that the first doping film has a direct interface to the first fin. A top surface of the second fin is also doped (e.g., ion implantation of a p-type dopant). After doping the top surface of the second fin, a second doping film is formed which includes a second dopant type (e.g., p-type) on the second fin. The second doping film has a direct interface to the second fin. The substrate including the first and second doping films is then annealed. In an embodiment, the annealing drives the first and second dopant types from the doping layers into the respective fin.

What is claimed is:

1. A method, comprising:
providing a semiconductor substrate having a first fin defined by sidewalls and a top surface and a second fin spaced a distance from the first fin and defined by sidewalls and a top surface;
performing a first doping process on the top surface of the first fin to form a doped top first fin, wherein at least a portion of the sidewalls of the first fin are not doped during the first doping process;
depositing a first doping film of a first thickness over the sidewalls of the doped top first fin, wherein the first doping film has a direct interface with the sidewalls of the doped top first fin;
performing a second doping process over the top surface of the second fin to form a doped top second fin, wherein at least a portion of the sidewalls of the second fin are not doped during the second doping process,
depositing a second doping film of a second thickness on the sidewalls of the doped top second fin, wherein the second doping film includes a different dopant type than the first doping film, and wherein the second doping film has a direct interface with the sidewalls of the doped top second fin;
removing the first doping film and the second doping film from the top surfaces of the first and second fins respectively such that a top surface of the first doping film, a top surface of the second doping film, the top surface of the first fin and the top surface of the second fin are all co-planar,
after removing the first and second doping films, performing an anneal process wherein the anneal process includes:
driving dopants of a first type from the first doping film into a region adjacent the sidewalls of the first fin; and
driving dopants of a second type from the second doping film into a region adjacent the sidewalls of the second fin; and
forming a gate structure on the first fin, wherein the gate structure interfaces the sidewalls and the top surface of the doped top first fin.

2. The method of claim 1, further comprising:
forming a first masking element on the second fin before forming the first doping film.

3. The method of claim 2, wherein the first doping film is formed on the first masking element.

4. The method of claim 2, further comprising:
removing the first masking element after forming the first doping film; and
forming a second masking element before forming the second doping film, wherein the second masking element is formed on the first fin and the first doping film.

5. The method of claim 1, wherein first doping film is boro-silicate glass (BSG).

6. The method of claim 1, wherein the second doping film is phosphosilicate glass (PSG).

7. A method, comprising:
providing a semiconductor substrate having a first fin defined by a top surface and a first sidewall and an opposing second sidewall, and a second fin spaced a distance from the first fin, wherein the second fin is defined by a top surface and a third sidewall and an opposing fourth sidewall;
doping the first fin, wherein the doping provides the top surface of the first fin to have a first concentration of a first type of dopants and the first and second sidewalls of the first fin to have a second concentration of the first type of dopants;
thereafter, forming a first doping film over the top surface and the first and second sidewalls of the first fin;
etching back the first doping film such that the first doping film is formed on the first sidewall of the first fin and on the second opposing sidewall of the first fin and the first doping film is not disposed on the top surface of the first fin thereby providing a top surface of the first doping film that is coplanar with the top surface of the first fin;

forming a second doping film on the second fin such that the second doping film is formed on the third sidewall of the second fin and on the fourth opposing sidewall of the second fin;

performing a high temperature process on the substrate including the etched-back first doping film and the second doping film, wherein the high temperature process simultaneously drives an n-type dopant from the first doping film into the first and second sidewalls of the first fin and a p-type dopant from the second doping film into the third and fourth sidewalls of the second fin; and forming a gate structure on the first fin, wherein the gate structure has a first interface with the first sidewall and a second interface with the second sidewall of the first fin.

8. The method of claim 7, further comprising:

forming a second gate structure on the second fin, wherein the second gate structure interfaces with the third and fourth sidewalls of the second fin and the top surface of the second fin.

9. The method of claim 7, wherein forming the first doping film includes forming a phosphosilicate glass (PSG) layer.

10. The method of claim 7, wherein forming the second doping film includes forming a boro-silicate glass (BSG) layer.

11. The method of claim 7, further comprising:

removing the first doping film and the second doping film from the semiconductor substrate after the high temperature process.

12. A method, comprising:

providing a semiconductor substrate having a first fin defined by a top surface and a first sidewall and an opposing second sidewall, and a second fin spaced a distance from the first fin, wherein the second fin is defined by a top surface and a third sidewall and an opposing fourth sidewall;

doping the top surface of the first fin;

after doping the top surface of the first fin, forming a first doping film over the first and second sidewalls of the first fin, wherein the first doping film has a first dopant type and is formed over the first fin such that the first doping film has a direct interface to the first and second sidewalls of the first fin and is not disposed on the top surface of the first fin, wherein the forming the first doping film on the sidewalls of the first fin includes:

forming the first doping film on the top surface of the first fin, and thereafter, etching the first doping film to expose the top surface of the first fin such that the first doping fin has a top surface coplanar with the top surface of the first fin;

after forming the first doping film, doping the top surface of the second fin;

after the doping the top surface of the second fin, forming a second doping film having a second dopant type, wherein the second doping film is disposed on the second fin such that the second doping film has a direct interface to the third and fourth sidewalls of the second fin and is not disposed on the top surface of the second fin;

annealing the substrate including the first and second doping films, wherein the annealing provides a first concentration of the first dopant type at the top surface of the first fin and a second concentration of the first dopant type at the sidewalls of the first fin; and after annealing, forming a gate structure on the first fin, wherein the gate structure interfaces the first and second sidewalls.

13. The method of claim 12, wherein the first doping layer is between approximately 1 nanometer and approximately 10 nanometers in thickness.

14. The method of claim 12, wherein the first doping layer includes less than approximately 10% by weight of the first dopant type.

15. The method of claim 12, wherein the annealing the substrate is performed at less than approximately 1200 Celsius.

* * * * *